(12) United States Patent
Smolka

(10) Patent No.: US 8,094,504 B2
(45) Date of Patent: Jan. 10, 2012

(54) BUFFERED DRAM

(75) Inventor: John Smolka, San Jose, CA (US)

(73) Assignee: Integrated Device Technology inc., San Jose, CA (US)

(*) Notice: Subject to any disclaimer, the term of this patent is extended or adjusted under 35 U.S.C. 154(b) by 101 days.

(21) Appl. No.: 12/006,599

(22) Filed: Jan. 4, 2008

(65) Prior Publication Data
US 2009/0175090 A1 Jul. 9, 2009

(51) Int. Cl.
*G11C 7/10* (2006.01)
(52) U.S. Cl. ......... 365/189.05; 365/230.08; 365/233.13; 365/189.17
(58) Field of Classification Search ............. 365/189.05, 365/191, 230.03, 230.08, 233.13, 63, 51, 365/99, 189.17; 711/115
See application file for complete search history.

(56) References Cited

U.S. PATENT DOCUMENTS

| | | | | |
|---|---|---|---|---|
| 6,016,282 A * | 1/2000 | Keeth | ........................ | 365/233.13 |
| 6,502,161 B1 * | 12/2002 | Perego et al. | ...................... | 711/5 |
| 6,646,936 B2 * | 11/2003 | Hamamatsu et al. | ......... | 365/201 |
| 6,697,888 B1 * | 2/2004 | Halbert et al. | .................. | 710/52 |
| 6,826,113 B2 * | 11/2004 | Ellis et al. | ................ | 365/233.13 |
| 7,072,201 B2 * | 7/2006 | So et al. | ........................... | 365/63 |
| 2004/0105292 A1 * | 6/2004 | Matsui | ............................ | 365/63 |
| 2006/0044927 A1 * | 3/2006 | Han et al. | ....................... | 365/232 |
| 2006/0291263 A1 * | 12/2006 | Wallner et al. | .................. | 365/63 |

* cited by examiner

*Primary Examiner* — Pho M Luu
*Assistant Examiner* — Thao Bui
(74) *Attorney, Agent, or Firm* — Hayes and Boone LLP

(57) ABSTRACT

A buffered DRAM that can be utilized in a DIMM or RDIMM package to reduce the load on the data lines connected to the package is presented. A buffered DRAM can include a DRAM memory cell; and a buffer coupled to receive data lines and strobe signals, the buffer further coupled to receive address and command signals. If data access is directed to a second DRAM, the buffer buffers the data and strobe signals for access by the second DRAM. If data access is directed to the buffered DRAM the buffer buffers the data and strobe signals for access by the DRAM memory cell.

4 Claims, 2 Drawing Sheets

BUFFERED DRAM

BACKGROUND

1. Field of the Invention

The present invention is related to memory applications and, in particular, to buffered DRAMs.

2. Discussion of Related Art

Dual In-Line Memory Modules (DIMMs) have become the industry standard for supplying random access memory (RAM) for computer applications. Each DIMM is typically a printed circuit board that includes a number of individual RAM chips. The RAM chips can be any memory chips, for example dynamic RAM (DRAM) chips or synchronous RAM (SRAM) chips. In some cases, the DIMM functions as a double data rate DIMM (DDR DIMM) where data is received both on the rising edge of the clock signal and on the falling edge of the clock signal.

As the demand for memory density increases, DIMM packages that contain a higher density of RAM chips become important. One such DIMM package is a registered DIMM package (RDIMM). In an RDIMM, address bits received on the address lines are registered in one or more registers before being presented to the RAM chips. The register acts as an electrical buffer, distributing the received memory address bits to each of the RDIMM RAM chips. As discussed above, DDR RDIMM packages receive data and address signals on both the rising and falling edges of the clock signal.

As the frequency of DIMM activity increases, which is especially true for a DDR RDIMM with DRAM, the data bus loading by DRAMs coupled to the DIMM can limit the possible memory density that DIMMs are able to achieve. As the frequency of DDR RDIMM increases, the allowed number of data loads, which corresponds to the number of RAM chips in the DIMM, is decreasing. As a partial solution to this problem, some manufacturers are utilizing a fully-buffered DIMM module with external discrete data buffers located in the DIMM itself, which can occupy considerable space in the DIMM.

However, there is a need to allow higher frequency DIMM configurations while still increasing the density of RAM chips.

SUMMARY

In accordance with embodiments of the present invention, a buffered DRAM is utilized in a DIMM package to increase DIMM density. A buffered DRAM according to some embodiments of the present invention includes a DRAM memory cell; a buffer coupled to receive data lines and strobe signals, the buffer further coupled to receive address and command signals, and wherein if data access is directed to a second DRAM the buffer buffers the data and strobe signals for access by the second DRAM and if data access is directed to the buffered DRAM the buffer buffers the data and strobe signals for access by the DRAM memory cell.

A registered dual in-line memory module (RDIMM) according to some embodiments of the present invention can include a buffered DRAM coupled to receive and buffer data and strobe signals from data lines and strobe lines; a register coupled to receive control and address signals; and at least one DRAM coupled to the buffered DRAM to receive data and strobe signals from the buffered DRAM and address and control signals from the register.

A method of operating a registered dual in-line memory module (RDIMM) according to some embodiments of the present invention includes receiving address and control signals into a register, the address and control signals corresponding to a memory access; determining in a first memory chip whether access is to the first memory chip or a second memory chip; and if the memory access is to the first memory chip, buffering in the first memory chip data and strobe signals between a memory cell of the first memory chip and data and strobe lines of the RDIMM, if the memory access is to the second memory chip, buffering in the first memory chip data and strobe signals between the second memory chip and the data and strobe lines of the RDIMM.

These and other embodiments will be described in further detail below with respect to the following figures.

Figure 1:
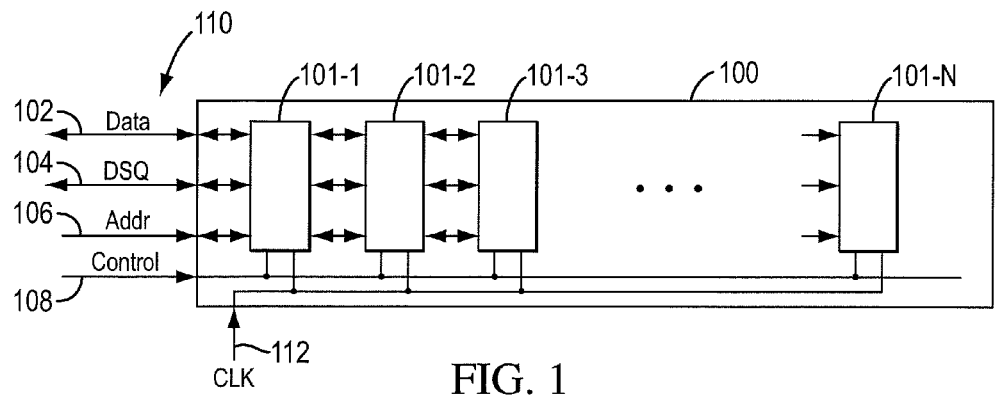
FIG. 1 illustrates a DIMM package.

In the drawings, elements having the same designation have the same or similar functions.

DETAILED DESCRIPTION

In the following description specific details are set forth describing certain embodiments of the invention. It will be apparent, however, to one skilled in the art that the present invention may be practiced without some or all of these specific details. The specific embodiments presented are meant to be illustrative of the present invention, but not limiting. One skilled in the art may realize other material that, although not specifically described herein, is within the scope and spirit of this disclosure.

In accordance with some embodiments of the invention, a buffered DRAM is presented. The buffered DRAM can include a DRAM memory cell; a buffer coupled to receive data and strobe signals, the buffer further coupled to receive address and command signals. If data access is directed to a second DRAM, the buffer buffers the data and strobe signals to the second DRAM. If data access is directed to the buffered DRAM the buffer buffers the data and strobe signals to the buffered DRAM memory cell. An RDIMM can include a buffered DRAM in the position of the first DRAM and couple all other DRAM chips to the buffered DRAM, thereby decreasing the load on the input lines to the RDIMM.

FIG. 1 illustrates a typical DIMM package 100. DIMM package 100 includes RAM memory chips 101-1 through 101-N, all coupled to data lines 102 to receive data, strobe lines 104 to receive strobe (DSQ/DSQ#) signals, address lines 106 to receive addresses, and control lines 108 to receive control signals. Data lines 102, strobe lines 104, address lines 106, and control lines 108 are included in the data bus 110 coupled to package 100. All of memory chips 101-1 through 101-N are also coupled to clock lines 112, which are also a part of buss 110, to receive clock signals. Each of RAM chips 101-1 through 101-N are coupled to the data, strobe, address, and control lines. In general, there may be any number of data lines 102, address lines 106, and control lines 108. In many embodiments there are 64 data lines along with the address lines, control lines, strobe lines, and clock lines. As can be seen from FIG. 1, the memory density is dependent on the number of RAM chips 101-1 through 101-N that can be coupled to the input lines of DIMM package 100.

Figure 2:
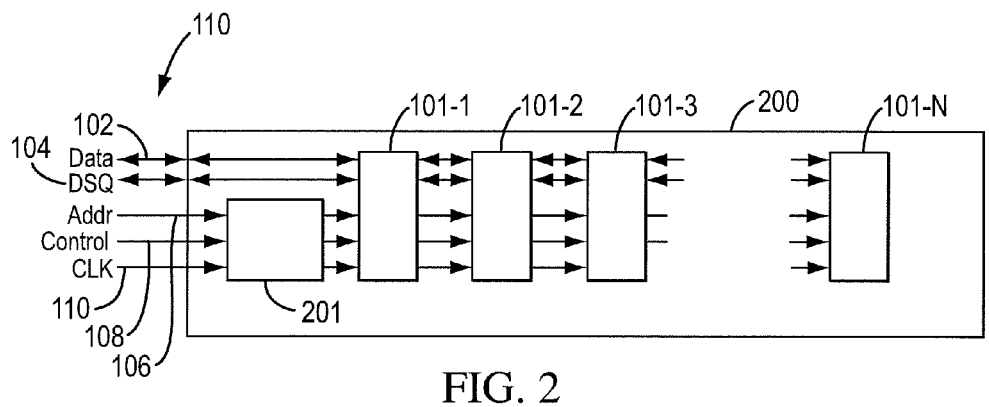
FIG. 2 illustrates an RDIMM package.

FIG. 2 illustrates an RDIMM package 200. In the case of RDIMM package 200, a register 201 that buffers signals received on address lines 106 and control lines 108 is included. Register 201 distributes the address and control signals received on address lines 106 and control lines 108 to RAM chips 101-1 through 101-N. Although register 201 takes up space in DIMM package 200, which may limit the number of RAM chips that can be supported physically, register 201 can be utilized to drive the inputs of more RAM chips than could otherwise be supported in DIMM package 100. However, RDIMM package 200 is still limited by the number of individual RAM chips 101 that can be coupled to data lines 102 and strobe lines 104.

Figure 3:
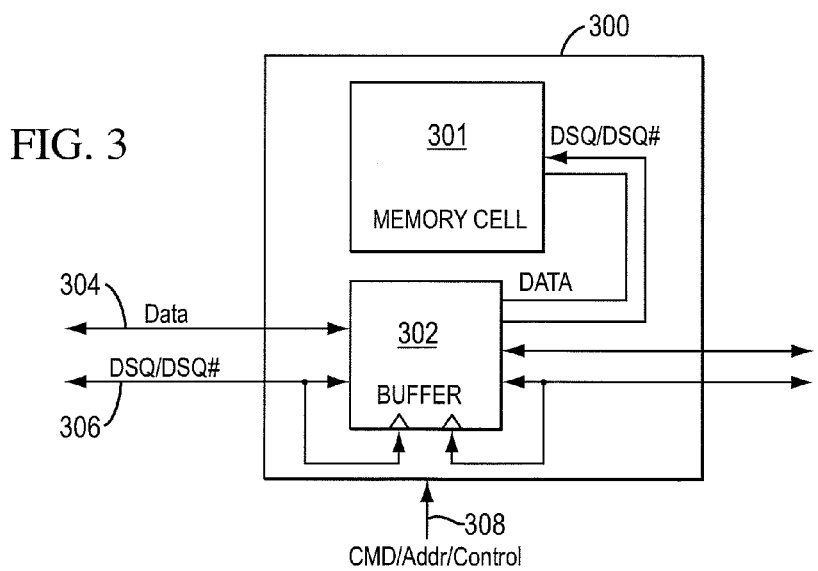
FIG. 3 illustrates a buffered DRAM according to some embodiments of the present invention.

FIG. 3 illustrates a buffered DRAM 300 according to some embodiments of the present invention. As shown in FIG. 3, buffered DRAM 300 includes a memory cell 301, which stores data, and a buffer 302. Buffer 302 is coupled to receive or provide data to the data lines 304, along with receiving or supplying strobe signals (DSQ/DSQ#), to strobe lines 306, depending on the type of memory access taking place. Memory access type, i.e. read or write, is determined by command signals on command/address/control lines 308. DRAM 300 also receives command, control, and address signals on lines 308. If the memory access is directed to DRAM 300, the buffered data received on data lines 304 and buffered strobe signals (DSQ/DSQ#) received on strobe lines 306 are supplied to memory cell 301. However, if the memory access is directed to a different DRAM chip than DRAM 300, then the buffered data and DSQ/DSQ# signals are coupled out of DRAM 300 to be coupled to the different DRAM chip for which they are intended. Additionally, if data is being read from DRAM 300, then the data and DSQ/DSQ# signals from memory cell 301 are buffered and provided to data lines 304 and DSQ/DSQ# lines 306. However, if data is to be read from a different DRAM chip, the data is input to DRAM 300 from the different chip, buffered in buffer 302, and provided to data lines 304 and strobe lines 306 through DRAM 300. As a result, the data and strobe lines coupled to DRAM 300 experience only a single load from DRAM 300 and multiple other DRAM chips can be coupled to DRAM 300 without providing further loading to the data and strobe lines of a DIMM package.

Figure 4:
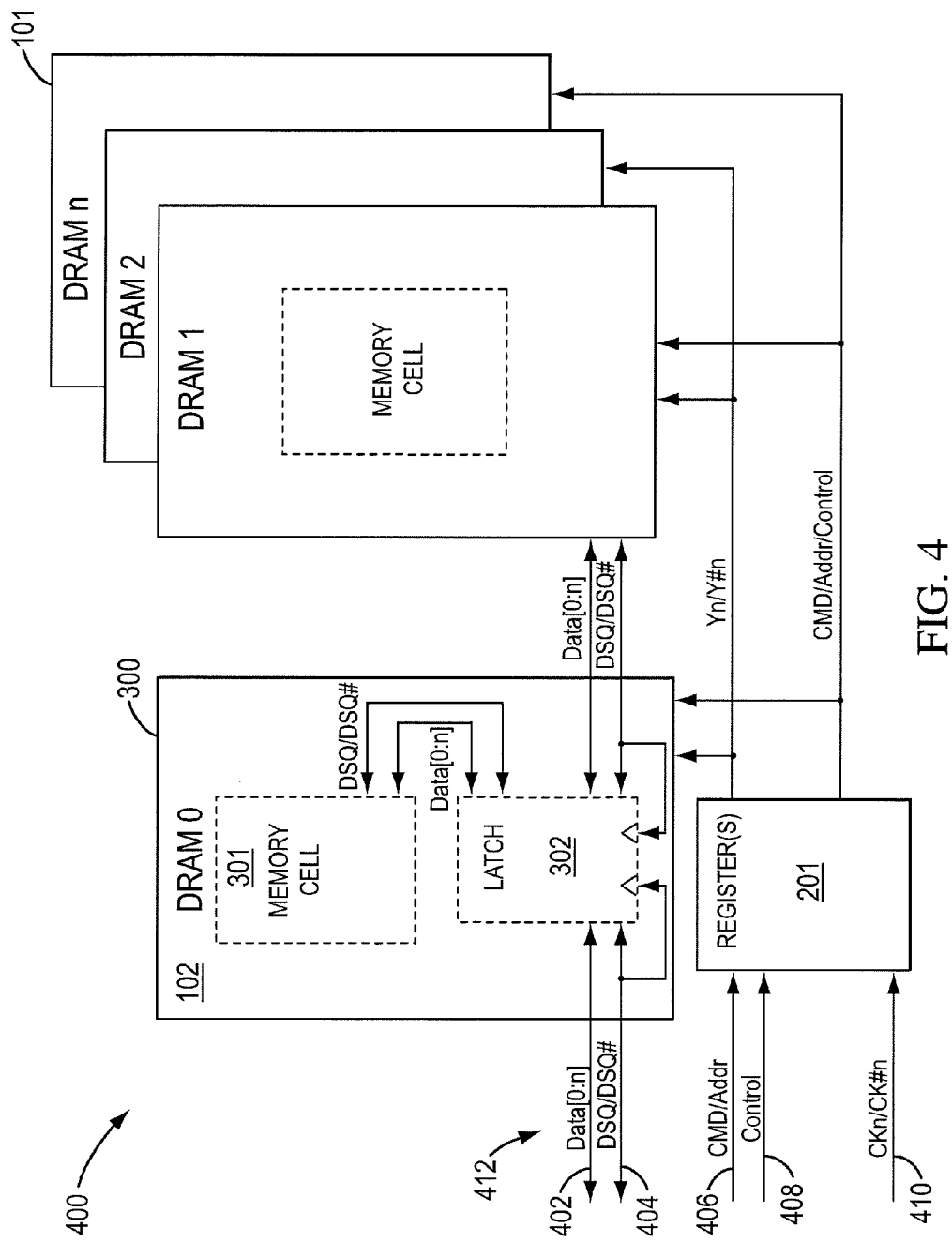
FIG. 4 illustrates a Buffered DRAM utilized in a DDR RDIMM configuration according to some embodiments of the present invention.

FIG. 4 illustrates a buffered DRAM 300 utilized in a DDR RDIMM package 400 according to some embodiments of the present invention. As shown in FIG. 4, buffer 302 is provided as a bi-directional data and strobe buffer ("latch") 302 as shown in DRAM 300, which is the zero'th DRAM located on the DIMM. DRAM 300 is then coupled directly to data lines 402 and strobe (DSQ/DSQ#) lines 404 of RDIMM package 400. Additional DRAMs 101 are coupled to buffer latch 302 via data lines 406 and 408. DRAM 300, which is coupled to data bus 402 and tied to rank 0, decodes received command and address signals and if the data access is for any of the additional DRAMs 101 (tied to other ranks), then DRAM 300 will buffer the data and strobe signals in buffer latch 302 for access by the other DRAMs 101 on data line 406. In the past, all of the DRAMs would have been coupled to the data lines 402 and strobe lines 404. In embodiments of the present invention, only one of the DRAMS, i.e., DRAM 300, is coupled to data lines 402 and strobe lines 404, which are connected at the pin connector of the DIMM package, and ultimately the system board and the controller. With only one data load per data line, higher density modules can be achieved. The buffered DRAM 300 can be utilized in DDR RDIMM Applications. The addition of buffer 302 to first DRAM 300 allows first DRAM 300 to buffer and provide access to the data and strobe signals by the other DRAMS 101, while presenting only a single load to the connector of RDIMM 400. As indicated with respect to FIG. 2, register 201 buffers address and control data, which is then supplied to DRAM 300 and DRAMs 101.

For illustrative purposes, embodiments of the invention have been specifically described above. This disclosure is not intended to be limiting. Therefore, the invention is limited only by the following claims.

What is claimed is:

1. A buffered DRAM, comprising:
   a first DRAM memory cell;
   a buffer coupled to the first DRAM memory cell and further coupled to receive and transmit data lines and strobe signals, the buffer further coupled to receive and transmit address and command signals, and
   wherein if data access is directed to a DRAM coupled to the buffered DRAM, the buffer couples the data and strobe signals out of the buffered DRAM for access by the DRAM coupled to the buffered DRAM and if data access is directed to the buffered DRAM the buffer couples the data and strobe signals for access by the first DRAM memory cell; further wherein the first DRAM memory cell and the buffer comprise a single DRAM circuit; further wherein
   only the buffered DRAM is coupled to data lines connected to a dual in line memory module (DIMM) connector.

2. A registered dual in-line memory module (RDIMM), comprising:
   a first DRAM circuit comprising a first DRAM memory cell and a buffer coupled to the first DRAM memory cell and further coupled to transmit, receive and buffer data and strobe signals using data lines and strobe lines; wherein the first DRAM memory cell and the buffer comprise a single DRAM circuit;
   a register coupled to receive and transmit control and address signals;
   at least a second DRAM coupled to the first DRAM circuit to receive data and strobe signals from the first DRAM circuit and address and control signals from the register; wherein
   only the first DRAM circuit is coupled to data lines connected to a dual in line memory module (DIMM) connector.

3. The RDIMM of claim 2, wherein the first DRAM circuit comprises:
   a DRAM memory cell;
   a buffer coupled to receive and transmit data signals and strobe signals, the buffer further coupled to receive and transmit address and command signals, and
   wherein if data access is directed to a second DRAM the buffer couples the data and strobe signals out of the first DRAM circuit for access by the second DRAM and if data access is directed to the first DRAM circuit the buffer couples the data and strobe signals for access by the memory cell in the first DRAM circuit.

4. A method of operating a registered dual in-line memory module (RDIMM), comprising:
   receiving address and control signals into a register, the address and control signals corresponding to a memory access the RDIMM comprising a first memory chip having a memory circuit and a buffer, the memory circuit and the buffer comprising a single chip;
   determining in a first memory chip whether access is to the first memory chip or a second memory chip coupled to the first memory chip; and
   if the memory access is to the first memory chip, buffering in the first memory chip data and strobe signals between a memory cell of the first memory chip and data and strobe lines of the RDIMM;
   if the memory access is to the second memory chip, buffering in the first memory chip data and strobe signals between a memory cell of the second memory chip and data and strobe lines of the RDIMM; and transferring the buffered data and strobe signals to the second memory chip; wherein
   only the first memory chip is coupled to data lines connected to a dual in line memory module (DIMM) connector.

* * * * *